United States Patent [19]

Bartilson et al.

[11] Patent Number: 5,321,581
[45] Date of Patent: Jun. 14, 1994

[54] AIR DISTRIBUTION SYSTEM AND MANIFOLD FOR COOLING ELECTRONIC COMPONENTS

[75] Inventors: Bradley W. Bartilson, Chippewa Falls; James J. Jirak, Jim Falls, both of Wis.

[73] Assignee: Cray Research, Inc., Eagan, Minn.

[21] Appl. No.: 855,384

[22] Filed: Mar. 20, 1992

[51] Int. Cl.[5] .......................... H05K 7/200
[52] U.S. Cl. .................. 361/695; 165/135; 181/211; 361/735
[58] Field of Search ............... 174/15.1, 16.1; 361/383, 384, 393, 394, 415, 689, 690, 694, 695, 728, 729, 735; 165/121, 135; 62/414, 418, 259.2; 34/20, 214; 181/211, 224, 201, 202

[56] References Cited

U.S. PATENT DOCUMENTS

| | | |
|---|---|---|
| 3,141,999 | 7/1964 | Schneider . |
| 3,198,991 | 8/1965 | Barnett . |
| 3,417,814 | 12/1968 | Oktay . |
| 3,592,260 | 7/1971 | Berger ................. 165/121 |
| 3,737,728 | 6/1973 | Austin . |
| 3,741,292 | 6/1973 | Askalu et al. . |
| 3,956,673 | 5/1976 | Seid ..................... 361/384 |
| 4,104,700 | 8/1978 | Hutchison et al. . |
| 4,148,534 | 4/1979 | Veburg ................. 312/236 |
| 4,204,247 | 5/1980 | Wigley . |
| 4,279,325 | 7/1981 | Challis ................. 181/211 |
| 4,378,859 | 4/1983 | Satomi ................. 181/224 |
| 4,450,472 | 5/1984 | Tuckerman et al. . |
| 4,535,385 | 8/1985 | August et al. . |
| 4,536,824 | 8/1985 | Barrett et al. . |
| 4,628,407 | 12/1986 | August et al. . |
| 4,758,926 | 7/1988 | Herrell et al. . |
| 4,894,749 | 1/1990 | Elko ..................... 181/202 |
| 5,064,454 | 11/1991 | Pittman ................ 55/302 |
| 5,177,666 | 1/1993 | Bland .................. 62/259.2 |
| 5,207,613 | 5/1993 | Ferchau ............... 454/184 |

FOREIGN PATENT DOCUMENTS

| | | |
|---|---|---|
| 0129966 | 2/1988 | European Pat. Off. . |
| 1274165 | 11/1986 | U.S.S.R. . |
| 1476628 | 4/1989 | U.S.S.R. .............. 361/384 |

OTHER PUBLICATIONS

"Impingement of a Simulated Electronics Package with a Square Array of Round Air Jets", T. Hamadah, HTD-vol. 111, *Heat Transfer in Electronics*, pp. 107–112, 1989.

"On the Accommodation of Coolant Flow Paths in High-Density Packaging", W. Nakayama, *InterSociety Conference on Thermal Phenomena*, pp. 101–112, 1990.

"Heat-Transfer Microstructure for Integrated Circuits", D. Tuckerman, Stanford University, pp. 1–141, 1984.

"Impingement Cooling of Electronics: Effects of Venting Through Circuit Board", B. Hollworth et al., Alfred University, pp. 80–96.

"Heat Transfer From Pin-Fins Situated in an Oncoming Longitudinal Flow Which Turns to Crossflow", Sparrow et al., *Int. J. Heat Mass Transfer*, vol. 25, No. 5, pp. 603–614, 1982.

(List continued on next page.)

*Primary Examiner*—Gerald P. Tolin
*Attorney, Agent, or Firm*—Daniel J. Kluth

[57] ABSTRACT

An air distribution system for electronic components utilizes an air supply unit with a silencer unit. The silencer unit attenuates sound associated with the air unit blowers with inlet and discharge silencers. The blowers have check valves which provide for isolating each blower for continued operation even with one blower. The cooling air is transported to a circuit board module stack from the blowers through ducts and a bank of rod valves. The valves allow maximum air flow to the modules with minimum resistance. The ducts have a flexible portion which have quick disconnects and act to isolate the modules from vibrations and static. The modules utilize channels in an air plate with different sized baffles to provide even distribution of cooling air to the printed circuit boards.

18 Claims, 7 Drawing Sheets

OTHER PUBLICATIONS

"Performance Comparisons Among Geometrically Different Pin-Fin Arrays Situated in an Oncoming Longitudinal Flow", Larson et al., *Int. J. Heat Mass Transfer*, vol. 25, No. 5, pp. 723-725, 1982.

"Experimental Investigation of Multi-Jet Impingement Cooling of an Array of Microelectronic Heat Sources", Jiji et al., The City College of the City University of New York, pp. 1-32, 1986.

"High-Performance Heat Sinking for VLSI", Tuckerman et al., *IEEE Electron Device Letters*, vol. EDL-2, No. 5, pp. 126-129, 1981.

"Heat Treansfer in Forced Convection Through Fins", R. Keyes, *IEEE Transactions on Electron Devices*, vol. ED-31, No. 9, pp. 1218-1221, 1984.

"Air Jet Impingement Cooling of an Array of Simulated Electronics Packages", T. Hamadah, HTD-vol. 111, *Heat Transfer in Electronics*, pp. 97-105, 1989.

"Impingement Cooling of Electronics", B. Hollworth et al., HTD-vol. 111, *Heat Transfer in Electronics*, pp. 89-96, 1989.

"Prediction of Surface Temperature and Heat Flux of a Microelectronic Chip with Jet Impingement Cooling", X. Wang et al., *Journal of Electronic Packaging*, vol. 112, pp. 57-62, 1990.

"Heat Transfer with Impinging Jets", R. Goldstein, *Proceedings of the Symposium on Nonlinear Problems in Energy Engineering*, Argon National Labs, pp. 7-15, 1983.

"Local Heat Transfer Coefficients Under an Axisymmetric, Single-Phase Liquid Jet", J. Stevens et al., HTD-vol. 111, *Heat Transfer in Electronics*, pp. 113-119, 1989.

"Thermal Performance Characeristics of Air-Cooled Cold Plates for Electronic Cooling", B. Yimer et al., HTD-vol. 111, *Heat Transfer in Electronics*, pp. 143-148, 1989.

"Flow Visualization in an Impinging Circular Air Jet", A. Behbahani et al., HTD-vol. 112, *Heat Transfer Measurements, Analysis, and Flow Visualization*, pp. 143-148.

"Local Heat Transfer to Staggered Arrays of Impinging Circuit Air Jets", A. Behbahani et al., *Transactions of the ASME*, vol. 105, pp. 354-359, 1983.

"IBM Packs in High Density Circuits", *Computer Design*, pp. 254-255, 1984.

"Effect of Inlet, Exit, and Fin Geometry on Pin Fins Situated in a Turning Flow", E. Sparrow et al., pp. 1039-1053, 1984.

"Forced-Convection, Liquid-Cooled, Microchannel Heat Sinks for High-Power-Density Microelectronics", R. Phillips et al., pp. 295-318.

"Thermal Impact of Double-Sided Printed Circuit Cards", T. Davis, IBM Systems Technology Division, pp. 11-15.

AIR DISTRIBUTION SYSTEM AND MANIFOLD FOR COOLING ELECTRONIC COMPONENTS

BACKGROUND OF THE INVENTION

1. Field of the Invention

The present invention relates to an apparatus and method for air cooling printed circuit board modules which minimizes the spacing of the boards and minimizes the associated sound.

2. Description of the Prior Art

Devices for cooling printed circuit boards are well known. Conventional methods utilize either air cooling across the faces of the boards or liquid cooling circulating liquid within a plate attached to the board when configured as a board module. Liquid cooling has been used for most, but not all, super computer applications as previous air cooling techniques could not accommodate three-dimensional packing density with short signal path lengths required by the high frequency and high integrated circuit count super computers. However, liquid cooling has several drawbacks as there are higher facilities cost for heat exchange units and refrigerant condensing units which are required. In addition, liquid cooling also has a higher operating cost due to higher electrical power needs and substantially more mechanical parts. Liquid cooling requires more floor space and higher initial costs due to increased associated mechanical machinery. Liquid cooling also uses expensive and highly evaporative dielectric coolants which pose safety hazards, thus requiring additional safeguards for handling the coolant liquid.

Although air cooling may be preferred for the reasons stated above, there are several drawbacks that must be overcome to provide adequate air cooling. Prior systems have used a centrifugal blower, but the centrifugal blowers cannot provide the pressure required using miniature heat sinks and also have a very high temperature rise as the air passes through the blower. Use of rotary positive displacement blowers provides sufficient pressure, flow rate, and reduced temperature rise, but creates different problems regarding noise control. Positive displacement blowers have noise in lower frequencies, in the range of 125–250 hertz, which must be silenced with a combination of reactive and dissipative silencers. Desired computer room noise levels in the range of 75 decibels could not be obtained using standard commercial silencers even when used in a tandem arrangement. To achieve improved noise levels, a larger volume silencer was required and/or large pressure drops would be experienced. In computer room environments, space is very valued and additional space required for the silencing equipment can often not be spared.

Due to the high costs involved in operating super computers and other high density integrated circuits, there must be provided oversizing and redundancies to ensure that system downtime is reduced to a minimum.

In addition to providing space for external cooling machinery, the boards or modules must be sufficiently spaced to allow enough air flow across the boards to carry the excess heat away. There are applications wherein high density is important. Board density with air cooling may be lower than that required to obtain comparable cooling capacity from a liquid cooled system. This increases the volume of the stack of boards or board modules due to the increased spacing between the boards.

Air cooling also has problems associated with uneven flow and pressures. Entrance ends of the cooling area are likely to have less flow than an opposite end of the chamber and the mid portions of the chamber. Attempts to equalize the flows and pressures across an area typically require increasing the size of manifolds or employing complicated duct systems. Such uneven cooling leads to oversizing of the cooling system to accommodate localized hot spots in the boards which may occur due to uneven flow and eddies which may form in the air currents The problem of providing adequate even cooling without excessive size and control is increased when control valving is required Flow may need to be varied due to increased heat generation or changes in the surrounding environment.

It can be seen then that an improved apparatus and method for cooling stacks of circuit board modules are required which provide adequate cooling and minimize the associated noise and space required for ventilation. It can also be seen that it would be advantageous to utilize air for cooling rather than liquids if comparable board densities and comparable cooling are obtained.

SUMMARY OF THE INVENTION

The present invention is directed to an apparatus and method for providing directed and ducted flow for cooling electrical components. In particular, the present invention is directed to a system utilizing air cooling to cool stacks of printed circuit board modules.

According to the present invention, the ventilation system has a pair of blowers driven by electric motors and utilized with a silencer both before and after flow reaches the blowers. Silencers reduce the associated noise and also are configured to minimize resistance to flow. The silencers have check valves both before and after the flow path surrounding the blowers so that each blower may be isolated and removed if necessary while the other blower remains running. The duct work for the blowers and passage to electrical components is substantially rectangular to maximize the area of the ducts with the least amount of space and to minimize flow resistance. In addition, the ducts are mounted with flexible portions to isolate vibrations from the blowers and motors.

After passing through the silencers, the air flow is directed with riser ducts to the valve chambers which distribute air substantially evenly to each module in the stack. The chambers include a series of rod valves with each rod valve delivering flow to an associated module. The rod valves utilize a housing and rod which each have an orifice extending therethrough along a substantial portion of the sides. When the rod is rotated in the housing to align the orifices, the valves are open. A quarter turn from the open position fully closes the valve as the rod body blocks the opening in the housing of the valve. It can be appreciated that this provides maximum flow while providing a minimum flow resistance in the space. The valve also allows a substantially rectangular configuration to maximize flow and minimize resistance.

Flow is directed from the valves through ducts to the modules and then along channels in air plates between circuit boards in each module. The air plate channels have orifices placed therealong to cool integrated circuit sites in the module. A series of baffles which are placed a portion of the way along the channel also direct a portion of the flow through the associated orifice. In this manner, substantially even flow is maintained over each orifice so that cooling flow is substantially equal through each orifice. The baffles increase in size further along the channel to direct a greater portion of the decreasing flow through its associated orifice to maintain substantially equal flow through each orifice.

These and various other advantages and features of novelty which characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a preferred embodiment of the invention.

BRIEF DESCRIPTION OF THE DRAWINGS

In the drawings, wherein like reference letters and numerals indicate corresponding elements throughout the several views.

DETAILED DESCRIPTION OF THE PREFERRED EMBODIMENT(S)

Figure 1:
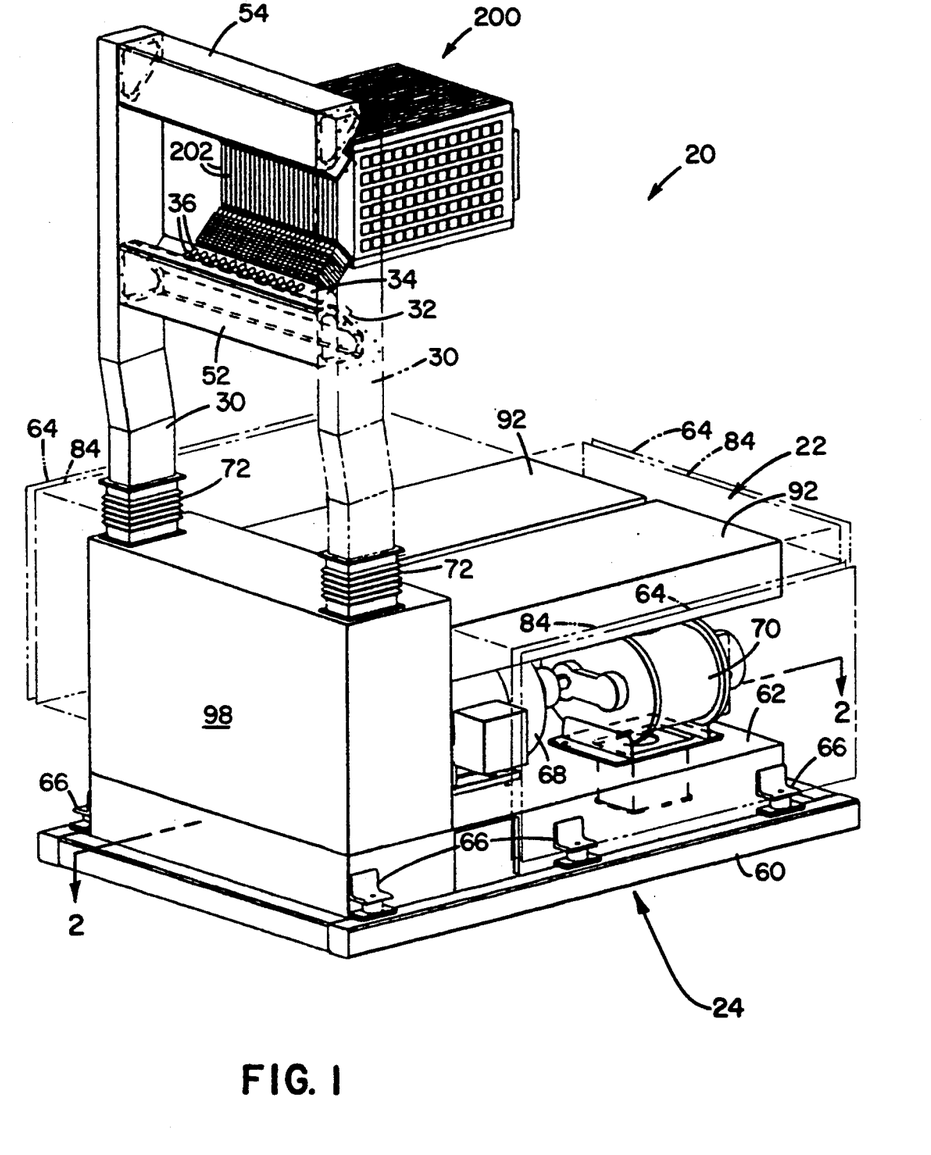
FIG. 1 shows a perspective view of a stack of a circuit board module stack and an air distribution apparatus according to the principles of the present invention.
Figure 5:
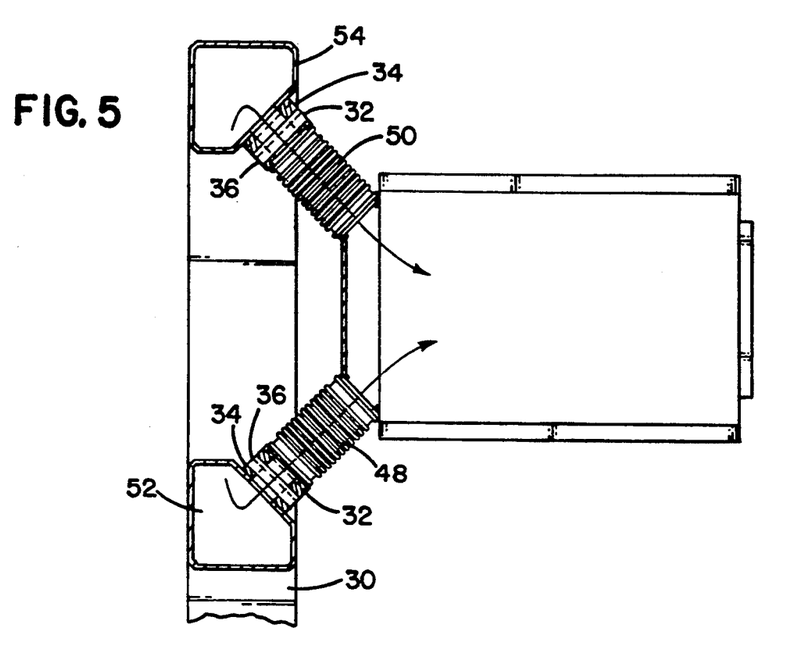
FIG. 5 shows a side elevational view of the circuit board module stack shown in FIG. 1 and associated duct work shown in section.

Referring now to the drawings, and in particular to FIG. 1, there is shown a cooling apparatus, generally designated 20, for cooling a stack 200 of printed circuit board modules 202. The cooling apparatus 20 utilizes an air supply unit 22 and silencer unit 24 for providing cooling air. Cooling air is transported to the module stack 200 through ducts 30 rising to valve chambers 32. From the valve chambers 32, air flow is controlled and distributed throughout the stack 200. The valve chambers 32 have a plurality of valves 36 mounted in valve housings 38. The valve chambers are located proximate upper and lower cross ducts 54 and 52, as also shown in FIG. 5. Each housing 38 has a plurality of the valves 36 corresponding to each printed circuit board module 202. Each valve 36 delivers cooling to one half of an air plate between printed circuit boards in each module. The valving arrangement provides for controlling flow to each space individually to maintain board temperatures at or below predetermined levels.

In the embodiment shown, the module stack 200 is utilized as a fiber driver receiver acting as a high speed connection between main frame computers. It can be appreciated that the circuit board module stack 200 may have other uses, such as placement in main frame computers, and utilize the principles of the present invention with configurations for cooling adapted to the available space. The high cost of operating mainframe computers warrants redundancies and safeguarding components to maintain cooling.

The ducts to each module 202 provide for increased or decreased flow to an individual module as each board may have different cooling needs at different times, depending on the operations being performed by the computing system. Each pair of opposing boards in a module 202 is cooled by an adjustable airstream which may be varied to accommodate the cooling requirements of the circuits on the opposing faces.

Figure 2:
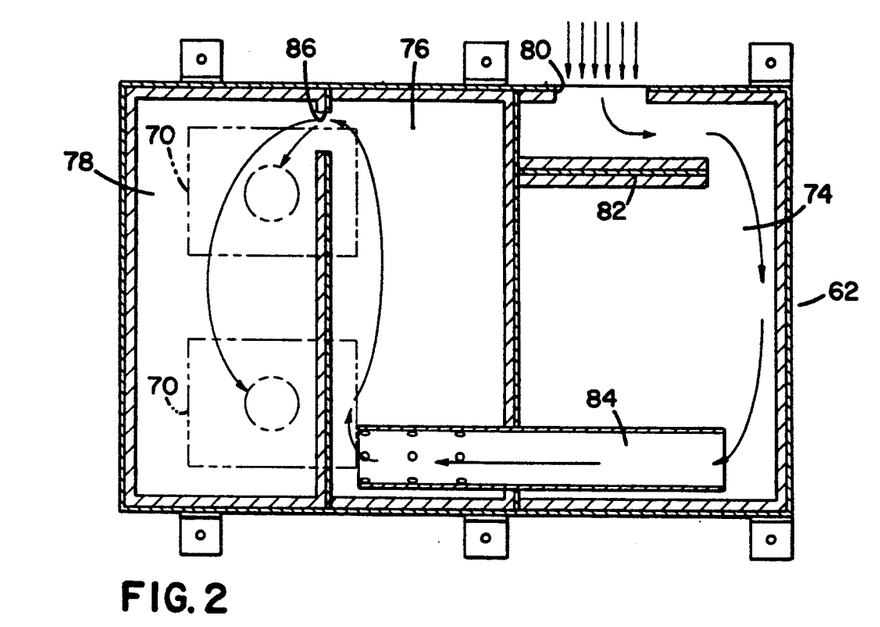
FIG. 2 shows a sectional view of a silencer box of the air distribution apparatus taken along line 2—2 of FIG. 1.
Figure 3:
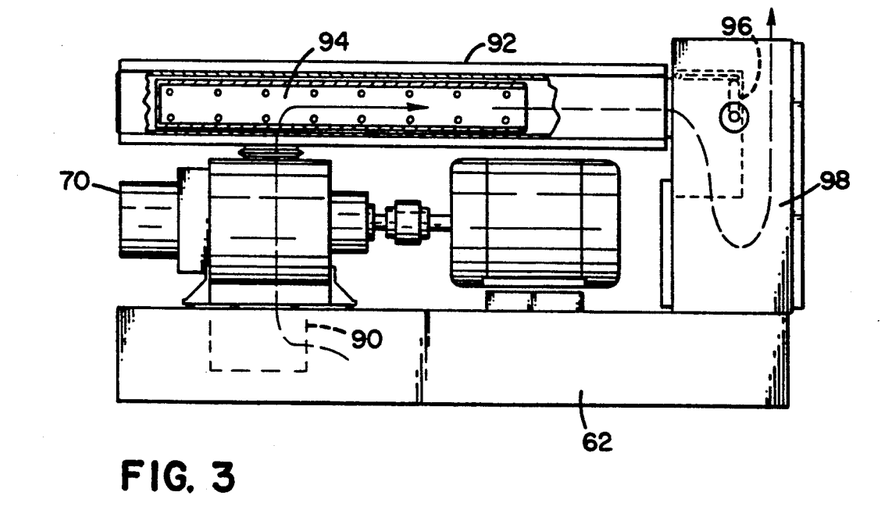
FIG. 3 shows a side elevational view with portions broken away of the blowers and silencers of the air distribution apparatus shown in FIG. 1.

As shown in FIGS. 1 and 3, the air supply unit 22 is placed within a silencer unit 24 having a large inlet silencer 62 on an inlet silencer base 60. Cushioning mounts 66 act as dampers to decrease vibrations associated with motors 68 driving blowers 70. In the preferred embodiment, a pair of rotary positive displacement blowers 70 is utilized, each blower being driven by an associated motor 68. The blowers 70 provide sufficient pressure with minimal temperature rise in the air as it passes through the blowers. As shown in FIG. 2, the air is directed through the inlet silencer 62 along a winding path with a series of baffles arranged to form chambers 74, 76 and 78 which are lined with sound insulation 82 to absorb the noise.

The air enters the inlet silencer 62 at inlet 80 and strikes a baffle which directs the air flow to a first chamber 74. The flow then passes to a choke tube 84 near a corner opposite the inlet 80. In the preferred embodiment, the choke tube 84 has perforations spaced about its surface and is tuned to one fourth the wavelength of the airstream. The air leaves the choke tube 84 and strikes a wall of a second chamber 76. The flow is spread throughout the second chamber 76 and leaves through a passage 86. The passage 86 leads directly to a third chamber 78. From the third chamber 78, the flow passes through check valves 90 directly beneath each blower 70 as shown in FIG. 3.

Air leaves each blower 70 and flows through an associated discharge silencer 92. Each discharge silencer 92 houses a second choke tube 94 to decrease noise from the blowers 70. Air exits the discharge silencer 92 through a second check valve 96 to an air box 98 which acts as a further muffler.

Figure 4:
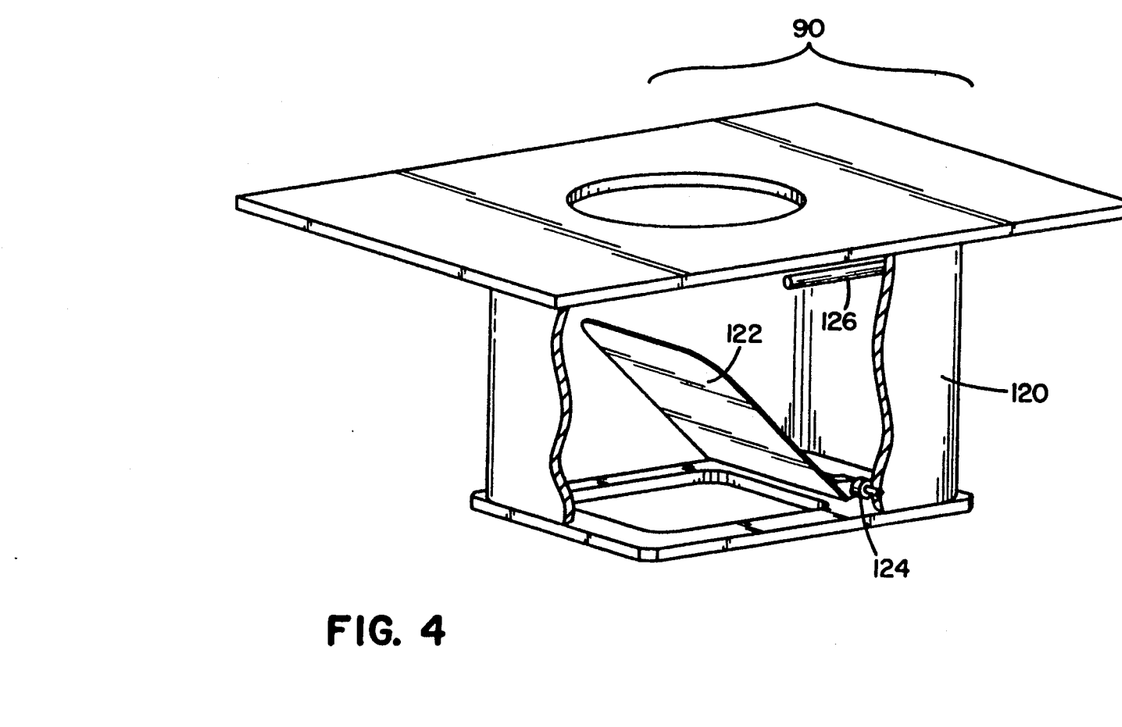
FIG. 4 shows a perspective view with portions broken away of a check valve for the silencers shown in FIG. 3.

As shown in FIG. 4, each check valve 90 has a housing 120 with a gate 122 pivotally mounted on a hinge 124. The check valves 90 and 96 provide for isolation of each blower 70 and prevent reverse circulation through an idle blower. The gate 122 is lightweight so that once the suction pressure overcomes the weight of the gate, the valve 90 opens and minimal force is required to keep the gate open. Once the gate 122 has been opened, the force required to maintain it in an open position is minimal, as the center of gravity of the gate 122 approaches the over center position of the pivot point at the hinge 124. The check valve housing 120 has a stop 126 which is engaged by the gate 122 when fully open which prevents the gate from swinging past center. When fully opened, the gate 122 is out of the flow stream, thereby having minimum resistance to air flow.

With the check valves 90 and 96 in the air flow path on either side of each blower, each blower 70 and associated discharge silencer 92 may be isolated and removed from the flow path while the other blower remains running. This provides for repairs being made while online, minimizing ventilation system and circuit downtime.

In addition to attenuating the noise associated with the air flow through the blowers, the noise of the blowers 70 and motors 68 given off externally must be insulated. As shown in FIG. 1, it can be appreciated that according to the present invention, the inlet silencer 62, discharge silencer 92 and air box 98 form insulated walls around the blowers 70 and motors 68 for sound attenuation. This is accomplished utilizing minimal additional space. The remaining three exposed sides can then be covered with a shroud formed of sound insulating panels 64 to fully enclose the blowers 70 and associated motors 68. The panels 64 are preferably lined with sound insulation 82 to improve sound attenuation.

Figure 11:
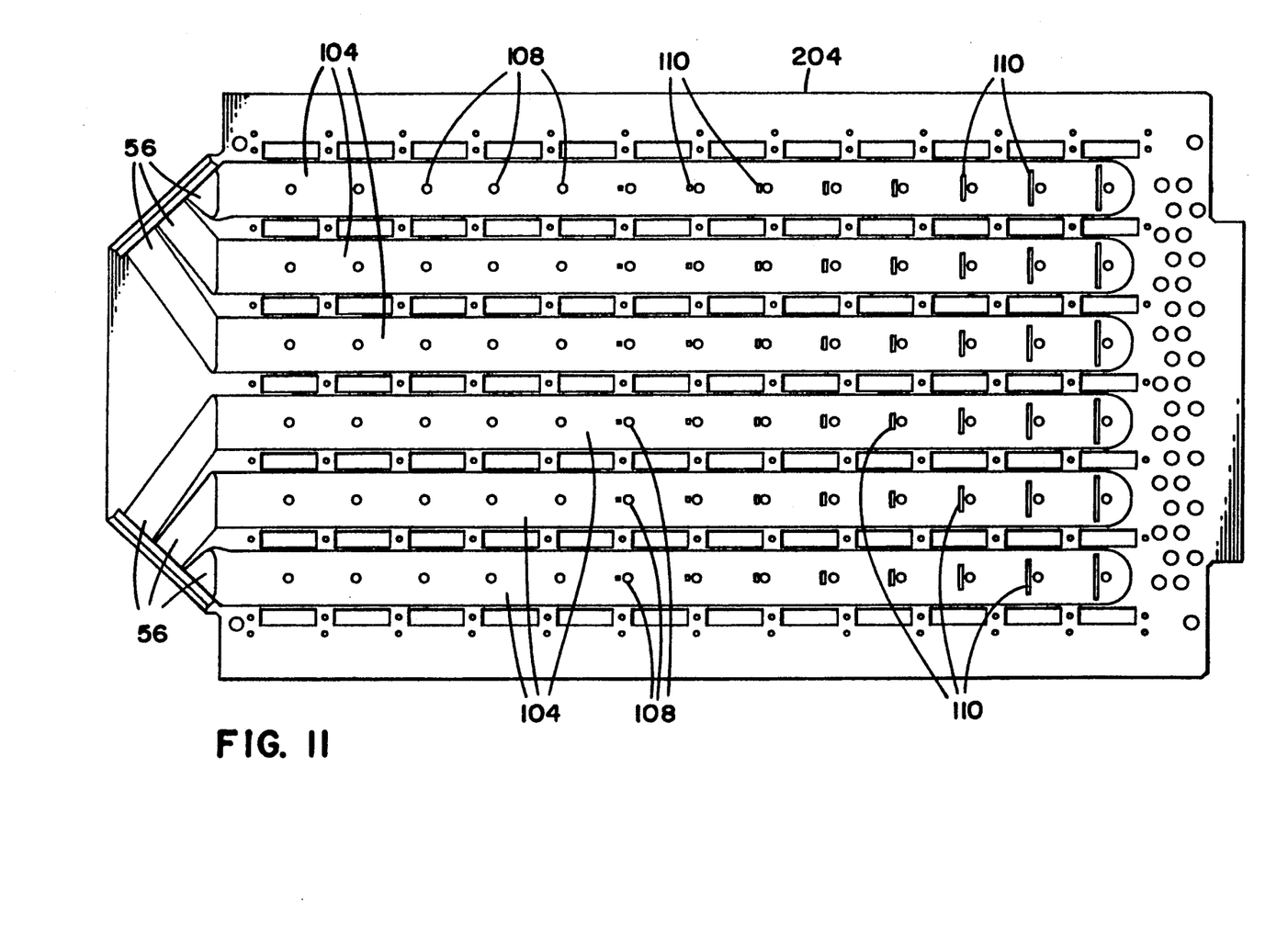

As shown in FIG. 1, the cooling air leaves the air box 98 through parallel riser ducts 30. The riser ducts 30 are each mounted with a flexible accordion-type section 72 connecting to the air box 98. The flexible sections 72 provide vibration isolation so that movement is not transferred along the riser ducts 30. The riser ducts 30 connect to a lower cross duct 52 and an upper cross duct 54. The upper and lower ducts 54 and 52 direct flow to the valve chambers 32. As shown in FIG. 11, the riser and valve arrangements provide for splitting the air flow to upper and lower halves of each air plate 204 of a circuit board module in the module stack.

Figure 6:
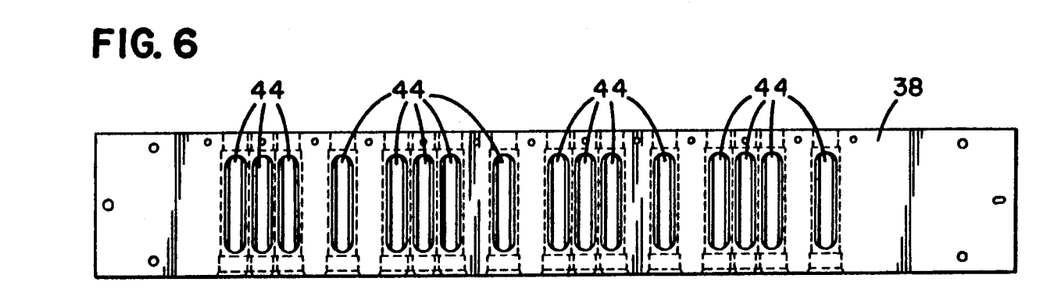
FIG. 6 shows a side elevational view of the valve housing for the ducts to the circuit board module stack.
Figure 7:
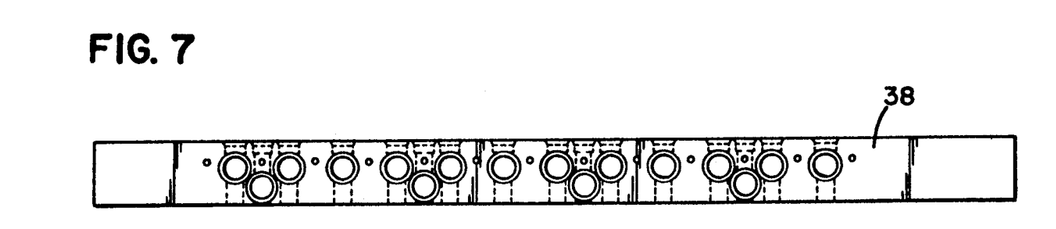
FIG. 7 is a top plan view of the valve housing shown in FIG. 6.
Figure 8:
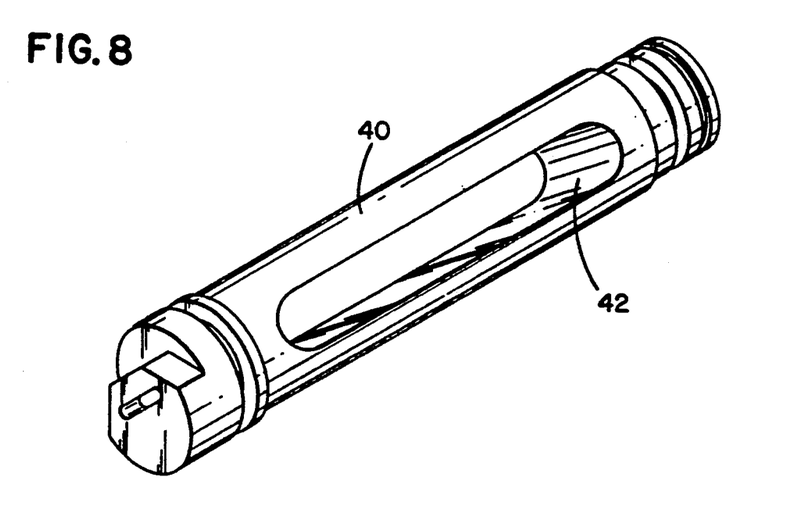
FIG. 8 shows a perspective view of a rod valve body.

Referring to FIG. 5, air in the valve chamber 32 is directed through a bank of valves 36, if open. Each rod valve 36 uses a rod 40 with an orifice 42 extending axially along the rod, shown in FIG. 8. The valve housing 38 shown in FIG. 6 and 7 has similarly-shaped orifices 44 extending therealong. When the rod 40 is rotated and the orifices 42 and 44 align, the valve 36 opens. When the orifices 42 and 44 are fully aligned, the valve 36 is fully open. From the open position, when the rod 40 is rotated one quarter turn, the orifices 42 and 44 are fully disaligned and the valve 36 is fully closed. In this closed position, the body of the rod 40 blocks the orifice 44 of the valve housing 38 to close off cooling air flow. It can be appreciated that the rod valve 36 provides maximum flow area through the rectangular flow path in the chamber 32.

In the preferred embodiment, magnetic reed switches are located proximate the rod valves 36. The switches are either opened or closed as the valves 36 are opened and closed. The switches of the upper and lower rod valves associated with each module are connected in series to the power supply to that module, so that if one of the valves is closed, the power to the module will be disabled. In the preferred embodiment, the reed switches are also in series with a "burn-line" and thermal fuses on the circuit boards of the module, so that power to the module is also disabled if a predetermined temperature is exceeded.

Figure 9:
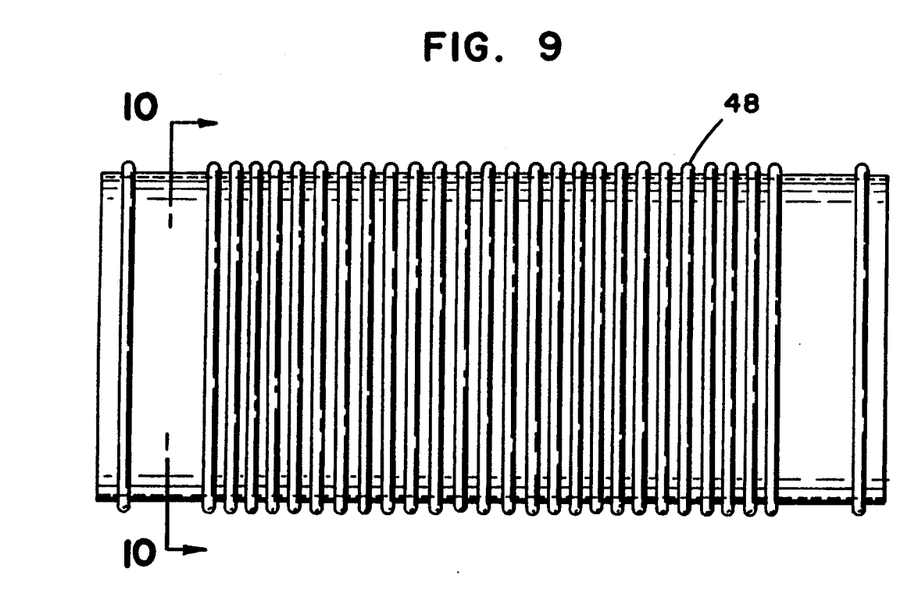
FIG. 9 shows a side elevational view of a flexible duct.
Figure 10:
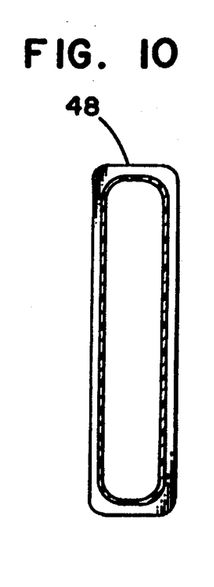
FIG. 10 shows and end sectional view of the flexible duct taken along line 10—10 in FIG. 9; and, FIG. 11 shows a side view of an air plate portion of a circuit board module.

After the cooling air has passed through the valves 36, it is directed through flexible ducts 48 and 50 which are angled, as shown in FIG. 5. The ducts 48 and 50 direct the cooling air flow at an angle toward the ends of the circuit board modules 202. The ducts 48 and 50 are rectangular, as shown in FIGS. 9 and 10, to maximize flow to the rectangular components of the module stack 200 and to minimize flow resistance by maximizing the area of a cross section of the flow. As shown in FIG. 11, channels 56 adjacent the ends of the circuit board modules receive flow from the flexible ducts 48 and 50 shown in FIG. 5 and keep the flow separated along an upper and a lower portion of the modules 202. As shown in FIG. 11, the flow passes into channels 104 in the air plates 204 along their length and exiting through orifices 108 and out the opposite end.

The flexible duct 48 shown in FIGS. 9 and 10 is flexible and has a rectangular configuration. This maximizes flow capacity to the rectangular components with minimal air resistance. The rectangular cross section also provides for tightly stacking the modules 202 without widening for duct work. In addition, the ends of the ducts 48 are quick disconnects which attach to the valve housing 38 and to the ends of the modules 202. This provides for quickly removing and inserting a single module without powering down the entire system. The duct 48 is axially compressed when inserted with sufficient resiliency and spring constant necessary to seal itself at both ends. The flexible ducts 48 and the valve housings 38 are constructed of a static dissipative plastic which has sufficient durability to withstand the air pressures of the system. It can be appreciated that the flexible ducts 48 act to isolate the static and vibrations of the rest of the system from the module stack 200.

As shown in FIG. 11, in the preferred embodiment, each air plate 204 has three channels 104 per side for a total of six channels per plate. The cooling air takes on heat generated from the circuits and carries it away from the boards. The flow generated is sufficient so that the boards are placed on 0.730 inch centers, thereby obtaining a board density and cooling comparable to that for liquid cooling. This is obtained without compromising noise standards and avoids the safety hazards associated with liquid cooling.

The channels 104 serve as manifolds to thirteen integrated circuit sites on each side of the air plate 204. The channels 104 have orifices 108 spaced along the channels to distribute the cooling air to an associated integrated circuit site. Several of the channels 104 have baffles 110 which act as flow blocks to distribute the flow substantially evenly through the orifices 108 to cool the integrated circuit sites 106. In the preferred embodiment, the baffles 110 begin after the first five orifices 108 and are gradually increased in area. This directs a portion of the flow into the preceding orifice, so that further down the channel 104, the flow decreases. Therefor, the baffles 110 require increased size further along the flow path to deflect a substantially equal amount of cooling air flow to each associated orifice 108.

It can be appreciated that with the valves 36, ducts 48 and 50, and channels 104 configured as shown, each module 202 may be isolated and removed without interruption of operation of other modules 202 or the cooling provided to the other modules. This arrangement eliminates downtime on the entire system, as was previously required to remove or service a single module 202.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. A cooling apparatus for electrical components, comprising:
    electrical modules including a plurality of circuit board modules;
    ventilating means for providing cooling air flow;
    duct means connected to the ventilating means for directing cooling air from the ventilating means to the circuit board modules comprising a plurality of ducts, wherein each duct leads to an associated circuit board module;
    valving means comprising a plurality of rod valves, wherein a rod valve is disposed in each of the duct means for controlling air flow to the electrical module; and
    switch means for controlling power to the electrical modules, wherein each rod valve includes and actuates a respective switch of said switch means to an associated electrical module.

2. A cooling apparatus according to claim 1, wherein the valving means comprise a plurality of rod valves, each rod valve comprising a cylindrical valve body housing a rotatable rod, the valve body having opposed orifices extending along a substantial length of the body and the rod having an orifice extending therethrough along its side; wherein the rod is rotatable relative to the body to align the orifices of the rod and the body to open and close the valve.

3. A cooling apparatus according to claim 1, wherein the ventilation means comprises at least one blower, each blower having an associated pair of check valves upstream and downstream of the blower for isolating the blower.

4. A cooling apparatus according to claim 1, further comprising silencing means disposed in a portion of the duct means downstream from the ventilating means.

5. A cooling apparatus according to claim 4, wherein the silencing means comprise a silencer body having a series of chambers and at least one flow choke.

6. A cooling apparatus according to claim 5, wherein the silencing means further comprises a second silencer box following the ventilating mans in the air stream.

7. A cooling apparatus according to claim 1, wherein the duct means comprise riser ducts having a flexing portion isolating circuit board modules from vibration of the ventilating means.

8. A cooling apparatus according to claim 1, wherein the valving means comprises a plurality of rod valves, each rod valve having a rod body with an orifice extending along the rod, the rods inserting into a housing having a plurality of orifices aligned with the orifices of the rod bodies, and wherein the rod valves are mounted in the housing disposed in alternating rows, wherein the rod valves in a first row are offset from the rod valves in a second row.

9. A cooling apparatus according to claim 8, wherein each rod valve is rotatably mounted in the housing.

10. A cooling apparatus according to claim 8, wherein each rod valve comprises a rod and housing, wherein the rod extends into the housing and wherein the housing has an orifice positioned along the axis of the rods.

11. A cooling apparatus according to claim 1, wherein the electrical modules comprise circuit board modules, wherein each module has a plurality of channels extending through the module and a plurality of orifices spaced along each channel, wherein baffles are positioned along a portion of the channel for directing flow into associated orifices.

12. A cooling apparatus according to claim 11, wherein the baffler increase in area along the channel.

13. A cooling apparatus according to claim 8, further comprising a rectangular flexible duct extending from the one of the rod valves to an associated circuit board module.

14. A cooling apparatus according to claim 13, wherein he flexible duct has a quick disconnect between a valve and an associated circuit board module.

15. A cooling apparatus according to claim 1, wherein the valving means comprise a check valve for isolating flow, including:
    a valve body;
    a gate;
    a hinge connecting the gate to the valve body;
    wherein the gate pivots about the hinge, and the gate is weighted so that the force of the flow pushes the gate upward to an open position whereas the center of gravity of the gate approaches a position over a center point of the hinge; and
    stop means for preventing the gate from swinging open with its center of gravity passing over the center of the hinge.

16. A cooling apparatus for electrical components, comprising:
    a plurality of circuit board modules;
    ventilating means for providing cooling air flow;
    a plurality of rod valves, each rod valve having a rod body with an orifice extending along the rod, the rods inserting into a housing having a plurality of orifices aligned with the orifices of the rod bodies;
    duct means connected to the ventilating means for directing cooling air from the ventilating means to the circuit board modules, wherein the rod valves are disposed in the duct means, and wherein the duct means includes a plurality of flexible rectangular ducts, each duct connecting an associated rod valve to an associated circuit board module; and
    switch means for controlling power to the circuit board modules, each rod valve having an associated switch, wherein in an open valve position, the associated switch is closed, and wherein in a closed valve position, the associated switch is open.

17. A cooling apparatus according to claim 16, further comprising a plurality of channels extending through each circuit board module and a plurality of orifices spaced along each channel, wherein baffles are positioned along a portion of the channel for directing flow into associated orifices.

18. A cooling apparatus according to claim 16, wherein the rod valves are mounted in the orifices disposed in alternating rows, wherein the rod valves in a first row are offset from the rod valves in a second row.

* * * * *

UNITED STATES PATENT AND TRADEMARK OFFICE
CERTIFICATE OF CORRECTION

PATENT NO. : 5,321,581
DATED : June 14, 1994
INVENTOR(S) : Bartilson et al.

It is certified that error appears in the above-identified patent and that said Letters Patent is hereby corrected as shown below:

On cover page under OTHER PUBLICATIONS section, please delete "Heat-Transfer Microstructure" and insert --Heat-Transfer Microstructures-- therefor.

On cover page under OTHER PUBLICATIONS section, please insert --"Jet Impingement Flow Boiling of a Mixture of FC-72 and FC-87 Liquids on a Simulated Electronic Chip", T. Nonn et al., HTD-VOL. 111, <u>Heat Transfer in Electronics</u>, pp. 121-128, 1989.

In Column 7, line 47, please delete "mans" and insert --means-- therefor.

In Column 8, line 18, please delete "wherein he" and insert --wherein the-- therefor.

Signed and Sealed this

Ninth Day of September, 1997

*Attest:*

BRUCE LEHMAN

*Attesting Officer*  Commissioner of Patents and Trademarks